United States Patent
Horng et al.

(10) Patent No.: US 8,324,012 B2
(45) Date of Patent: Dec. 4, 2012

(54) TANDEM SOLAR CELL AND FABRICATING METHOD THEREOF

(75) Inventors: Sheng-Fu Horng, Hsinchu (TW);
Hsin-Fe Meng, Hsinchu (TW);
Ming-Kun Lee, Hsinchu (TW);
Jen-Chun Wang, Hsinchu (TW);
Tsung-Te Chen, Hsinchu (TW)

(73) Assignee: National Tsing Hua University, Hsin Chu (TW)

( * ) Notice: Subject to any disclaimer, the term of this patent is extended or adjusted under 35 U.S.C. 154(b) by 393 days.

(21) Appl. No.: 12/731,349

(22) Filed: Mar. 25, 2010

(65) Prior Publication Data
US 2011/0100431 A1    May 5, 2011

(30) Foreign Application Priority Data
Oct. 29, 2009   (TW) ................. 98136758 A (51) Int. Cl.
*H01L 21/00* (2006.01)
*H01L 21/30* (2006.01)
*H01L 21/46* (2006.01)

(52) U.S. Cl. ............ 438/74; 438/57; 438/61; 438/62; 438/64; 438/73; 438/455; 257/431; 257/E25.007; 257/E23.123; 126/243; 126/244

(58) Field of Classification Search ............ 438/57, 438/61, 62, 64, 73, 74, 455; 257/E25.007, 257/E23.123, 431; 136/243, 244
See application file for complete search history.

(56) References Cited

U.S. PATENT DOCUMENTS

| | | | | |
|---|---|---|---|---|
| 7,829,781 B2 * | 11/2010 | Montello et al. | ............ | 136/244 |
| 2010/0059101 A1 * | 3/2010 | Shinohara | ................. | 136/244 |

* cited by examiner

*Primary Examiner* — Kimberly Rizkallah
*Assistant Examiner* — Maria Ligai
(74) *Attorney, Agent, or Firm* — Ming Chow; Sinorica, LLC (57) ABSTRACT

A tandem solar cell and fabricating method thereof are disclosed. The steps of the fabricating method comprises: a top inverted solar cell having a plurality of inverted solar sub-cells is provided; a bottom normal solar cell having a plurality of normal solar sub-cells accompanying with the inverted solar sub-cells is provided; and processing fit process of the top inverted solar cell and the bottom normal solar cell is executed, wherein an interlayer is disposed between the bottom normal solar cell and the top inverted solar cell, and the interlayer includes a plurality of conductive dots. The plurality of inverted solar sub-cells and normal solar sub-cells are placed with an offset distance from each other, and a plurality of solar sub-cells are formed after the pressing fit process, and the plurality of solar sub-cells are series/parallel connection each other by electrically connecting the plurality of conductive dots.

6 Claims, 6 Drawing Sheets

FIG. 8

TANDEM SOLAR CELL AND FABRICATING METHOD THEREOF

FIELD OF THE INVENTION

The present invention relates to a tandem solar cell device and fabricating method thereof, and more particularly to an organic tandem solar cell device with a structure of series/parallel connection and fabricating method thereof.

BACKGROUND OF THE INVENTION

Because of several problems of fossil fuel energy with high cost and greenhouse effect, solving energy issue becomes an important task. The power generation of solar cells are applied by infinite solar energy and do not need fossil fuel, thus, solar cells now are utilized in satellite, space technology, and mobile communication. In view of energy saving, demands of the effective resource use and environmental pollution preventing, solar cells increasingly become attractive energy generators.

In 1954, the first inorganic solar cell formed on silicon (Si) is produced by Bell Laboratory in America, and such solar cell can transfer the solar radiation to electrical energy by photoelectric effect. However, the cost of the common solar cell formed on silicon wafer is higher than that of the others traditional power generation method (ex. fossil fuel thermal power plant), and doesn't meet the requirement of the production cost. Especially, the cost of solar cell formed on mono-crystalline silicon is high-priced. The cost of solar cells formed on polycrystalline silicon is lower than that of the solar cells formed on mono-crystalline silicon and the fabricating processes of the solar cells formed on polycrystalline silicon are easier than that of the solar cells formed on mono-crystalline silicon. However, the polycrystalline silicon solar cell is still difficult to popularize in daily life.

In recent years, organic materials such as polymer utilized to fabricate solar cell are catching academia and industry's attention. Polymer solar cells are fabricated by polymer materials similar with plastic property, and have advantages such as light weight, good flexibility, ruggedness, impact resistance, and low cost. Moreover, polymer solar cells also can be fabricated on a flexible plastic substrate or a thin metal foil substrate, and fabricated by spin-coating or doctor-blading with low cost. In view of these advantages, polymer solar cells are being as noteworthy new generation of solar cells.

Otherwise, the structures of organic polymer solar cells comprise a single-layer structure, a heterojunction structure, and a bulk heterojunction structure which is popular materials in research. The evolution of these structures is for the purpose of obtaining a solar cell device with higher energy conversion power and lowest cost to fabricate. However, promotion of the energy conversion power of single solar cell structure still has restriction. Therefore, a solar cell device which is utilized to stack several solar sub-cells in series/parallel connection is provide for increasing the energy conversion power of a solar cell.

A traditional fabricating method of a solar cell device with stacking several solar sub-cells in series/parallel connection is utilized to stack these solar sub-cells layer by layer. Regarding to FIG. 1, it shows a structure of a solar cell device with stacking several solar sub-cells in series connection. A solar cell device 100 is consisted of a first solar sub-cell 10 and a second solar sub-cell 20. The solar cell device 100 comprises a glass substrate 101 with a transparent conductive oxide layer, and a first solar sub-cell 10 is formed on the glass substrate 101. Then, a silver (Ag) layer 107 is formed on the first solar sub-cell 10, and the silver layer is utilized to provide an electron-hole pair recombination. The second solar sub-cell 20 is further formed on the silver layer 107. The first solar sub-cell 10 and the second solar sub-cell 20 have the same structure, which is consisted of a first heterogeneous material layer 103, 109 and a second heterogeneous material layer 105, 111 respectively, to form a heterogeneous interface. Finally, an exciton barrier layer 113 and a silver electrode 115 are formed on the second solar sub-cell 20.

Figure 1:
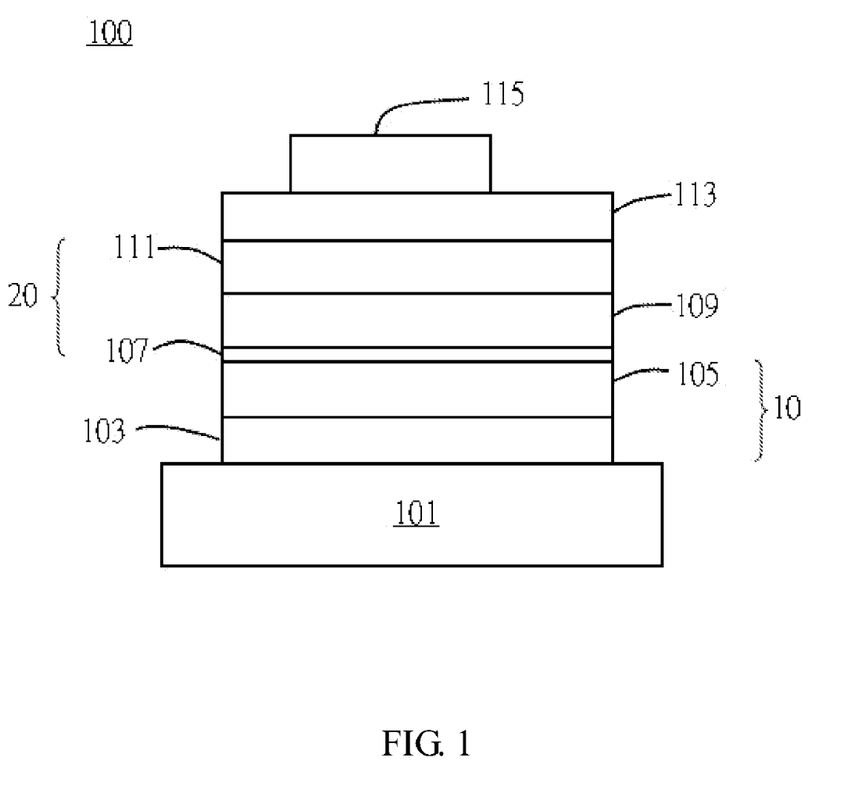
FIG. 1 is a structure diagram of series/parallel connection of a traditional tandem solar cell device.

The traditional fabricating method of the mentioned-above solar cell device 100 is described as below. At first, a glass substrate 101 with a transparent conductive oxide layer is provided. Then, a first heterogeneous material layer 103, a second heterogeneous material layer 105, a silver layer 107, another first heterogeneous 109, another second heterogeneous material layer 111, an exciton barrier layer 113, and silver electrode 115 are formed sequentially on the glass substrate 101. However, this fabricating method of the solar cell device 100 is needed to process in a vacuum environment, and difficult to reduce cost of production.

Furthermore, an organic polymer solar cell can be fabricated by using a simple process to achieve the effect of a large area. However, a multi-layer device fabricated by a solution process will produce solution miscible problem. The solution miscible problem will occur in a coating procedure of a second polymer layer after forming a first polymer layer. The coating procedure of the second polymer layer causes the first polymer layer dissolving such that the interface between of the first polymer layer and the second polymer layer blurred, and the total thickness of the structure also will be less by expectancy, and thereby greatly affecting the quality of the multilayer device.

Moreover, in recent years, the volume of electric device is reduced, and the volume of the accessory battery is also needed to reduce. However, in order to increase the energy conversion power of the mentioned-above solar cell structure formed by stacking in series/parallel connection, the numbers of the stacked solar sub-cells are increased due to the thickness of the solar cell device unable reducing effectively.

Otherwise, the mentioned-above method of stacking several solar sub-cells in series/parallel connection is to stack each solar sub-cell on the substrate sequentially. Therefore, the more solar sub-cells are stacked, the larger thickness of the solar cell device will be produced. Furthermore, the more stacked solar sub-cells also will produce more problems of layer by layer structure, such as the layout of electrodes are also needed to add for electrically connection of each solar sub-cell; or the energy conversion power of the solar cell device doesn't reach the expectancy.

Therefore, there is a need to develop an effective fabricating method of stacking several solar sub-cells in series/parallel connection, and the tandem solar cell device can add its energy conversion power effectively and the quality of the solar cell device can be ensured. Moreover, the fabricating method not only reduces the production cost but also reduces the thickness of the solar cell structure.

SUMMARY OF THE INVENTION

The first object of the present invention is to provide a tandem solar cell with high energy conversion power and small volume.

The second object of the present invention is to provide a fabricating method of a tandem solar cell with high energy conversion power and small volume.

The third object of the present invention is to provide a fabricating method of a tandem solar cell for series/parallel connection of several solar sub-cells without in a vacuum environment for reducing cost of the tandem solar cell.

The fourth object of the present invention is to solve the solution miscible problem of each layer of the structure of the tandem solar cell device fabricated by the traditional fabricating method of the tandem solar cell for series/parallel connection of several solar sub-cells.

In view of the foregoing objects, the present invention provides a fabricating method of a tandem solar cell, the steps comprising: providing a top inverted solar cell having a plurality of inverted solar sub-cells; providing a bottom normal solar cell having a plurality of normal solar sub-cells corresponding with the inverted solar sub-cells; and executing a pressing fit process of the top inverted solar cell and the bottom normal solar cell; wherein an interlayer and an antireflux protective device for preventing reflux occurrence are set between the bottom normal solar cell and the top inverted solar cell in the pressing fit process, wherein the interlayer includes a plurality of conductive dots, and the plurality of inverted solar sub-cells and normal solar sub-cells are placed with an offset distance from each other, a solar sub-cell is formed after pressing fit process of the inverted solar sub-cell and the normal solar sub-cell, and plurality of the solar sub-cell for series/parallel connection by the plurality of conductive dots.

Moreover, the present invention provides a tandem solar cell, comprising: a top inverted solar cell having a plurality of inverted solar sub-cells; a interlayer having a plurality of conductive dots and the interlayer connected to the top inverted solar cell; a bottom normal solar cell having a plurality of normal solar sub-cells, and the bottom normal solar cell connected to the interlayer; wherein a solar sub-cell is constructed by the inverted solar sub-cell and normal solar sub-cell, and the conductive dot is utilized to connect the inverted solar sub-cell and adjacent the normal solar sub-cell to construct a series/parallel connection the plurality of solar sub-cells structure.

One advantage of the present invention is that the tandem solar cell with series/parallel connection of several solar sub-cells is fabricated without in a vacuum environment, and the fabricating method is easy to practice for reducing cost of produce. The solution miscible problem occurred by the traditional fabricating method of a tandem solar cell is also resolved.

Another advantage of the present invention is that the tandem solar cell with series parallel connection of several solar sub-cells of the present invention has a small volume and high energy conversion power.

A detailed description is given in the following embodiments and with references to the accompanying drawings and claims.

DETAILED DESCRIPTION OF THE PREFERRED EMBODIMENT

The invention hereinafter will be described in greater detail with preferred embodiments of the invention and accompanying illustrations. Nevertheless, it should be recognized that the preferred embodiments of the invention are not provided to limit the invention but to illustrate it. The present invention can be practiced not only in the preferred embodiments herein mentioned, but also in a wide range of other embodiments besides those explicitly described. Further, the scope of the present invention is expressly not limited to any particular embodiments except what is specified in the appended Claims.

The present invention and embodiments now are described in detail. In diagrams and descriptions as below, the same symbols are utilized to represent the same or similar elements. The main of features of the embodiments of the present invention are described in highly simplified illustration. Otherwise, the drawings of the present invention do not depict every characteristic of the actuality embodiments, and all elements of the drawings are not depicted in proportional size but in relative size.

The present invention discloses a tandem solar cell with structure of series/parallel connection and the fabricating method thereof. An embodiment of the fabricating method of the tandem solar cell with structure of series/parallel connection according to the present invention is introduced first. Regarding to FIGS. 2-3, they are utilized to describe the fabricating method of the tandem solar cell with the structure of series/parallel connection, and accompany with FIG. 4, which shows the flow-chart thereof, for illustrating.

Figure 4:
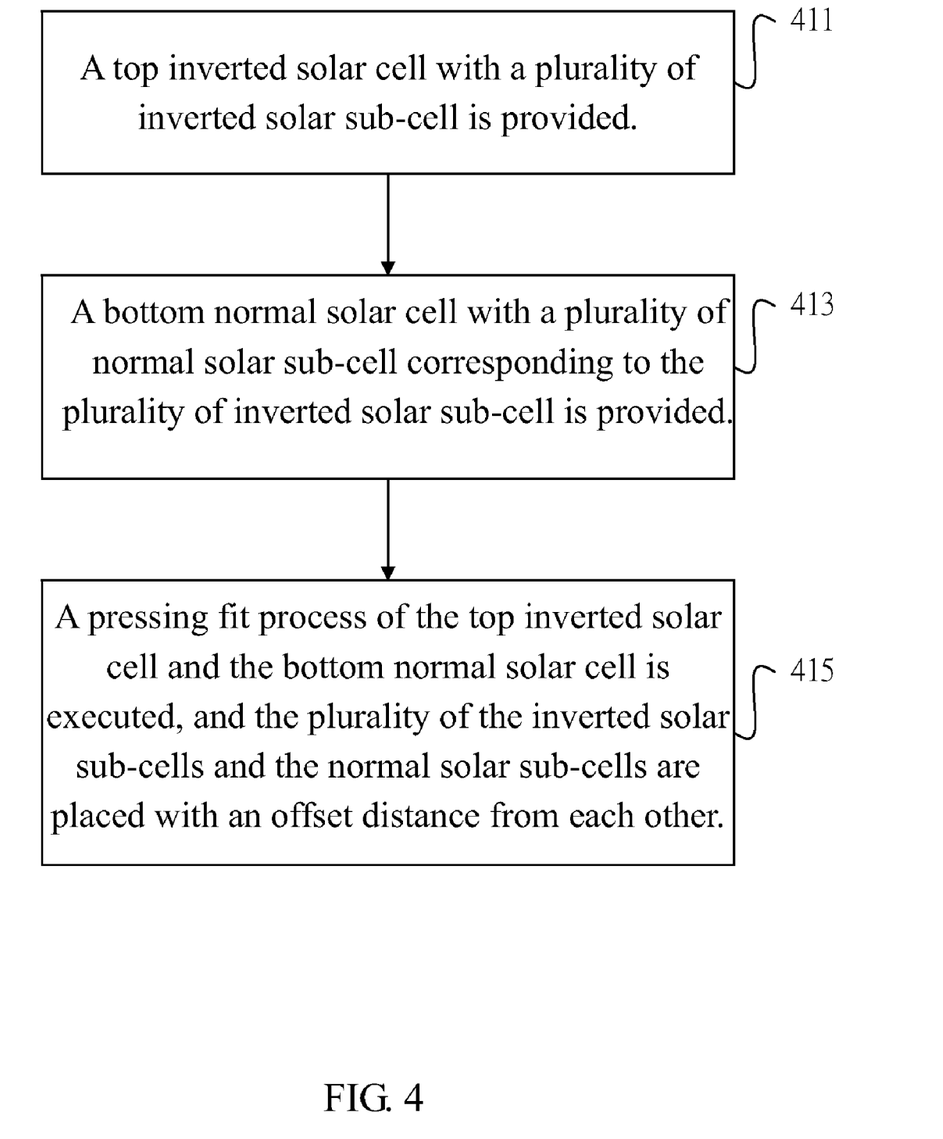
FIG. 4 is a chart-flow of the fabricating method of the tandem solar cell of the mentioned-above embodiment according to the present invention.

At first, regarding to the step 411 of the flow-chart of the fabricating method shown in FIG. 4, it shows that a top inverted solar cell with a plurality of inverted solar sub-cells is provided. Regarding to FIG. 2, it shows a diagram of the fabricating method of the tandem solar cell according to the present invention. A top inverted solar cell 200 is provided, and the top inverted solar cell 200 comprises a substrate 201. A plurality of inverted solar sub-cells 203 are formed on the substrate 201. In one embodiment of the present invention, the top inverted solar sub-cell 200 has three inverted solar sub-cells 203, which comprise a first inverted solar sub-cell 2031, a second inverted solar sub-cell 2032, and a third inverted solar sub-cell 2033. It's only used to describe the detail of the embodiment of the present invention, and do not limit the scopes of the present invention. For one person skilled in the art, increasing or decreasing the number of the inverted solar sub-cells 203 is the same technology with the present invention and needs to encompass in the scope of the present invention. In certain embodiments of the present invention, the substrate 201 may be any substrate for solar cell, for example, a glass substrate or a flexible substrate. In another certain embodiments of the present invention, the substrate 201 comprises a glass substrate or a flexible substrate with a transparent conductive oxide film, and the transparent conductive oxide film is utilized to being the cathode of the top inverted solar cell. In this embodiment, the substrate 201 comprises a glass substrate with an indium tin oxide (ITO) film, and the ITO film is the cathode of the top inverted solar cell.

Then, regarding to the step 413 of the flow-chart of the fabricating method shown in FIG. 4, it shows that a bottom normal solar cell with a plurality of normal solar sub-cell corresponding to the plurality of inverted solar sub-cell is provided. Regarding to FIG. 2, a bottom normal solar cell 300 is provided, and the bottom normal solar cell 300 comprises a substrate 301. A plurality of normal solar sub-cells 303 are formed on the substrate 301. In this embodiment, the numbers of the normal solar sub-cells 303 are also three corresponding to the numbers of the inverted solar sub-cells 203. The normal solar sub-cells 303 comprise a first normal solar sub-cell 3031, a second normal solar sub-cell 3032, and a third normal solar sub-cell 3033. For one person skilled in the art, increasing or decreasing the numbers of the normal solar sub-cells 303 is the same technology with the present invention and needs to encompass in the scope of the present invention. In certain embodiments of the present invention, the substrate 301 may be any substrate for solar cell, for example, a glass substrate or a flexible substrate. In another certain embodiments of the present invention, the substrate 301 comprises a glass substrate or a flexible substrate with a transparent conductive oxide film, and the transparent conductive oxide film is utilized to being the anode of the bottom normal solar cell. In this embodiment, the substrate 301 comprises a glass substrate with an ITO film, and the ITO film is the anode of the bottom normal solar cell.

Finally, regarding to the step 415 of the flow-chart of the fabricating method shown in FIG. 4, it shows a pressing fit process of the top inverted solar cell and the bottom normal solar cell is executed, and the plurality of the inverted solar sub-cells and the normal solar sub-cells are placed with an offset distance from each other (misalignment). Regarding to FIG. 2, it shows the tandem solar cell before the pressing fit process of the top inverted solar cell 200 and the bottom normal solar cell 300, and an interlayer 400 is disposed between the top inverted solar cell 200 and the bottom normal solar cell 300. The interlayer 400 further includes a plurality of conductive dots 410, 420. In this embodiment, the top inverted solar cell 200 comprises three inverted solar sub-cells 203 which are a first inverted solar sub-cell 2031, a second inverted solar sub-cell 2032, and a third inverted solar sub-cell 2033, respectively. The bottom normal solar cell 300 comprises three normal solar sub-cells 303 corresponding to the three inverted sub-cells 203, and the three normal solar sub-cells 303 are a first normal solar sub-cell 3031, a second normal solar sub-cell 3032, and a third normal solar sub-cell 3033. The interlayer is also divided to a first interlayer 401, a second interlayer 402, and a third interlayer 403 corresponding to the three inverted solar sub-cells 203 and the three normal solar sub-cells 303. Moreover, a first conductive dot 410 is disposed between the first interlayer 401 and the second interlayer 402, and a second conductive dot 420 is disposed between the second interlayer 402 and the third interlayer 403.

Furthermore, an anti-reflux protective device is also fabricated during the pressing fit process for preventing dispensable refluxes occurrence. The dispensable refluxes mean a phenomenon caused by short circuits of few sub-cells, and will reduce the efficiency of the device dramatically. In this embodiment, the anti-reflux protective device comprises an anti-reflux diode.

In the pressing fit process, the plurality of the inverted solar sub-cells and the normal solar sub-cells are placed with an offset distance from each other. In other words, the inverted solar sub-cells 203 aren't aligned to the normal solar sub-cells 303 but staggered arrangement for pressing fit. Regarding to the embodiment shown in FIG. 2, in the pressing fit process, the first inverted solar sub-cell 2031 and the first normal solar sub-cell 3031 are placed with an offset distance from each other, and the first interlayer 401 is placed in the overlap part (area). The second inverted solar sub-cell 2032 and the second normal solar sub-cell 3032 are also placed with an offset distance from each other, and so on. Moreover, the offset distance causes an overlapping area between the first normal solar sub-cell 3031 and the second inverted solar sub-cell 2032, and the first conductive dot 410 is placed on the overlapping area for electrical connecting the first normal solar sub-cell 3031 and the second inverted solar sub-cell 2032, and so on. In certain embodiments of the present invention, the pressing fit process is utilized a roller to press, such as roll-to-roll process.

Figure 3:
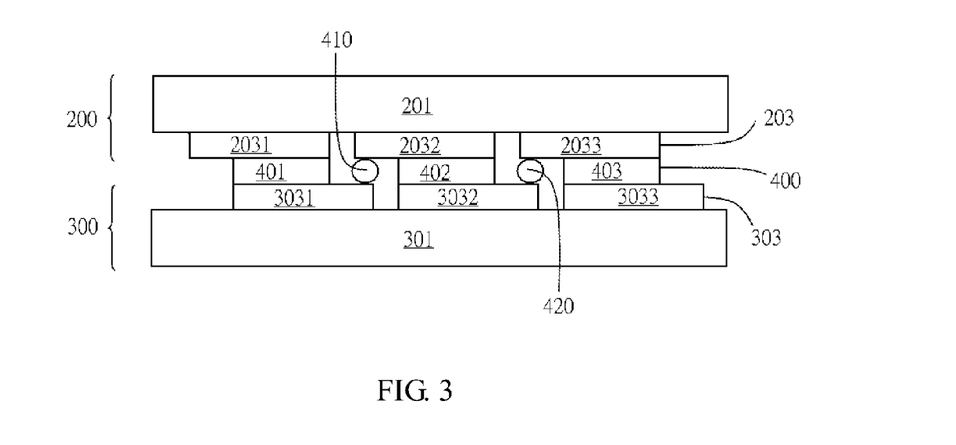
FIG. 3 is a structure diagram of the tandem solar cell of the mentioned-above embodiment according to the present invention.

Regarding to FIG. 3, it shows a tandem solar cell device of the present invention after pressing fit process for fabricating. A first solar sub-cell is consisted of the first inverted solar sub-cell 2031, the first interlayer 401, and the first normal solar sub-cell 3031; a second solar sub-cell is consisted of the second inverted solar sub-cell 2032, the second interlayer 402, and the second normal solar sub-cell 3032; and a third solar sub-cell is consisted of the third inverted solar sub-cell 2033, the third interlayer 403, and the third normal solar sub-cell 3033. Moreover, the first conductive dot 410 is placed in the overlapping area between the first normal solar sub-cell 3031 and the second inverted solar sub-cell 2032 for electrical connecting the first normal solar sub-cell 3031 and the second inverted solar sub-cell 2032; similarly, the conductive dot 420 is placed in the overlapping area between the second normal solar sub-cell 3032 and the third inverted solar sub-cell 2033 for electrical connecting the second normal solar sub-cell 3032 and the third inverted solar sub-cell 2033. Therefore, the first solar sub-cell and the second solar sub-cell are connected electrically by the first conductive dot 410, and the second solar sub-cell and the third solar sub-cell are connected electrically by the second conductive dot 420 for series/parallel connection of the first solar sub-cell, the second solar sub-cell, and the third solar sub-cell.

In this embodiment, the top inverted solar cell 200 and the bottom normal solar cell 300 are fabricated separately. Regarding to FIG. 5, it shows a structure diagram of the top inverted solar cell. In here, it's only utilized a signal inverted solar sub-cell to describe the top inverted solar cell, but do not limit in this. The top inverted solar cell comprises a substrate 201, and an inverted solar sub-cell 203 is formed on the substrate 201. The inverted solar sub-cell 203 further comprises a hole blocking layer (HBL) 213 or called electron selective layer, an active layer 215 or called absorption layer, an electron blocking layer (EBL) 217 or called a hole selective layer, and a top electrode 219.

Figure 5:
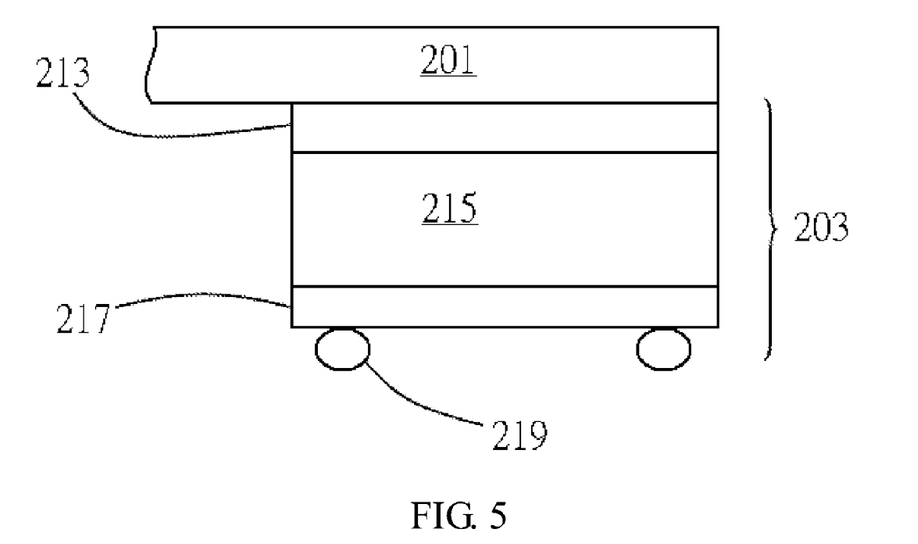
FIG. 5 is a structure diagram of a top inverted solar cell of a tandem solar cell of one embodiment according to the present invention.

The substrate 201 may be any substrate materials for solar cells. In certain embodiments of the present invention, the substrate 201 comprises a glass substrate or a flexible substrate. In another certain embodiment of the present invention, the substrate 201 comprises a glass substrate or a flexible substrate with a transparent conductive oxide film, and the transparent conductive oxide film is the cathode of the top inverted solar cell. In this embodiment, the substrate 201 comprises a glass substrate with an ITO film, and the ITO film is the cathode of the top inverted solar cell. The hole blocking layer 213 is utilized to block electronic holes. In certain embodiments, the materials of the hole blocking layer 213 comprise oxide materials such as zinc oxide (ZnO) or cesium carbonate ($Cs_2CO_3$), but do not limit in these. In this embodiment, the material of the hole blocking layer 213 comprises cesium carbonate layer.

The active layer 215 is utilized to absorb light, and is an interface of donor/acceptor. After illuminating a solar cell device, an exciton will be generated by the absorbed photon and then diffused to the interface of donor/acceptor. Due to the difference of energy band of the heterojunction, the exciton in the interface of donor/acceptor will be divided to electron and electronic hole. The electrons are transmitted to cathode, and the electronic holes are transmitted to anode. In certain embodiments of the present invention, the materials of donor of the active layer 215 comprise derivatives of thiophene, such as poly(3-hexylthiophene-2,5-diyl) (P3HT), polyacetylene, polyisothianaphthene (PITN), polythiophene, polypyrrol (PPr), polyfluorene (PF), poly(p-phenylene) (PPP) or poly(pheneylene vinylene) (PPV) and the derivatives thereof. In certain embodiments of the present invention, the materials of acceptor of the active layer 215 comprise related derivatives of fullerene. In another certain embodiments of the present invention, the material of acceptor of the active layer 215 comprises Buckminsterfullerene (C60) or the derivatives thereof. The Buckminsterfullerene is a kind of small molecule of fullerene, and has several advantages for utilizing to be acceptor, such as high electron affinity, transparent, and good electric conductivity. In this embodiment, the acceptor comprises a 1-(3-methoxycarbonyl) propyl-1-phenyl [6,6] C61 (PCBM), which is a derivative of C60.

The electron blocking layer 217 is utilized to be a transport layer of electronic holes. In certain embodiments, the electron blocking layer 217 comprises vanadium pentoxide ($V_2O_5$), molybdenum sesquioxide ($MoO_3$), poly (3,4-ethylenedioxythiopene) (PEDOT) or PEDOT:IPA, but does not limit in these. In this embodiment, the electron blocking layer 217 comprises PEDOT:IPA.

The top electrode 219 is the anode of the top inverted solar cell. In certain embodiments of the present invention, the top electrode 219 comprises metal materials with high work function or other transparent conductive oxide. In this embodiment, the top electrode 219 comprises a sliver layer.

Figure 6:
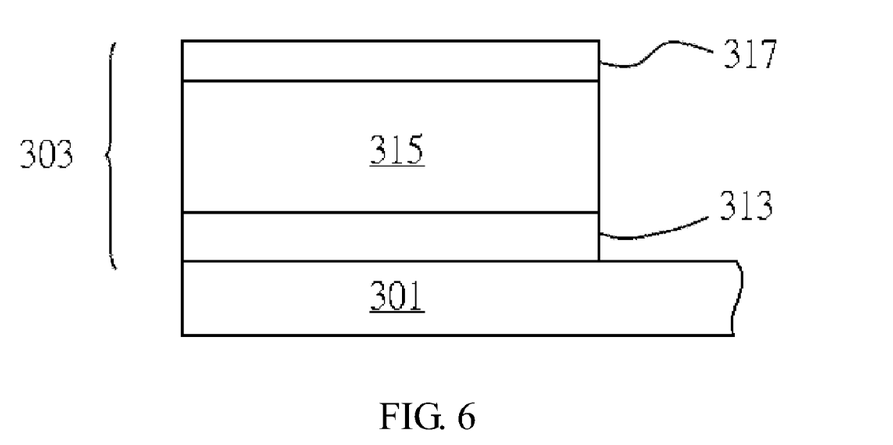
FIG. 6 is a structure diagram of a bottom normal solar cell of a tandem solar cell of one embodiment according to the present invention.

Regarding to FIG. 6, it shows a structure diagram of the bottom normal solar cell. In here, it's only utilized a signal normal solar sub-cell to describe the bottom normal solar cell, but do not limit in this. The bottom normal solar cell 300 comprises a substrate 301, and a normal solar sub-cell 303 is formed on the substrate 301. The normal solar sub-cell 303 comprises a hole transport layer 313, an active layer 315, and a top electrode 317.

The substrate 301 is the same with the substrate 201, which may be any substrate materials for solar cell. In certain embodiments of the present invention, the substrate 301 comprises a glass substrate of a flexible substrate. In another certain embodiments of the present invention, the substrate 301 comprises a glass substrate or a flexible substrate with a transparent conductive oxide film, and the transparent conductive oxide film is the anode of the bottom normal solar cell. In this embodiment, the substrate 301 comprises a glass substrate with an ITO film, and the ITO film the anode of the bottom normal solar cell. In here, the ITO film has several advantages for being the anode, such as good electric conductivity, good stability of chemical and thermal, and good penetrability in the range of visible light.

The hole transport layer 313 is utilized to transmit the electronic holes to the anode. In certain embodiments, the materials of the hole transport layer 313 comprise $V_2O_5$, $MoO_3$, PEDOT or PEDOT:IPA, but do not limit in this. In this embodiment, the material of the hole transport layer 313 comprises PEDOT.

The active layer 315 is the same with the active layer 215, which is an interface of donor/acceptor. In certain embodiment of the present invention, the materials of the donor of the active layer 315 comprise derivatives of thiophene, such as P3HT, polyacetylene, PITN, polythiophene, PPr, PF, PPP or PPV and the derivatives thereof. In certain embodiments of the present invention, the materials of the acceptor of the active layer 315 comprise related derivatives of fullerene. In this embodiment, the material of donor comprises P3HT, and the material of acceptor comprises PCBM.

The top electrode 317 is the cathode of the normal solar cell. In certain embodiments, the materials of top electrode 317 comprise metal with low work function or other transparent conductive oxide. The anode with high work function and the cathode with low work function can increase an internal electric field within the solar cell for transmitting carriers. In this embodiment, the top electrode 317 comprises a copper layer.

Figure 2:
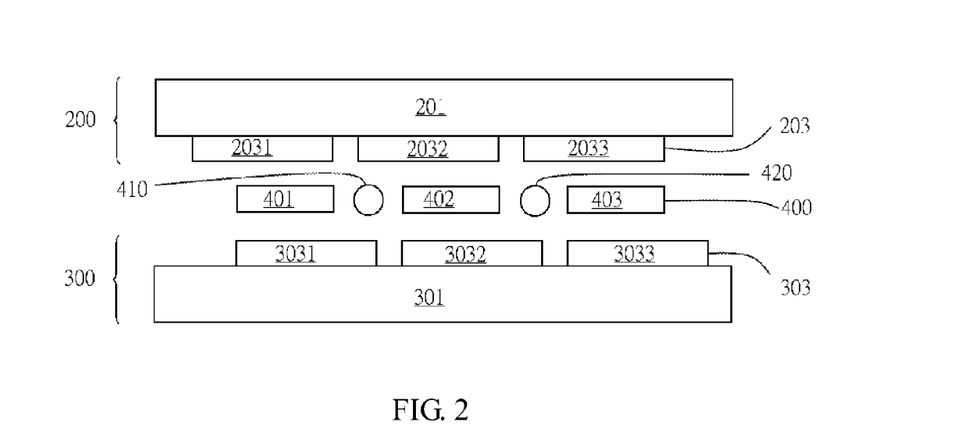
FIG. 2 is a diagram of a fabricating method of a tandem solar cell of one embodiment according to the present invention.

In certain embodiments of the present invention, the materials of the interlayer 400 comprise metal or semiconductor materials with bipolar transport property for connecting the top inverted solar cell 200 and the bottom normal solar cell 300. In another embodiment of the present invention, the materials of the interlayer 400 comprise sliver (Ag) or gold (Au). In this embodiment, the material of the interlayer 400 is sliver. Furthermore, in this embodiment, the material of the conductive dots 410, 420 comprises sliver for achieving to series/parallel connection of the several solar sub-cell according to the present invention.

Figure 7:
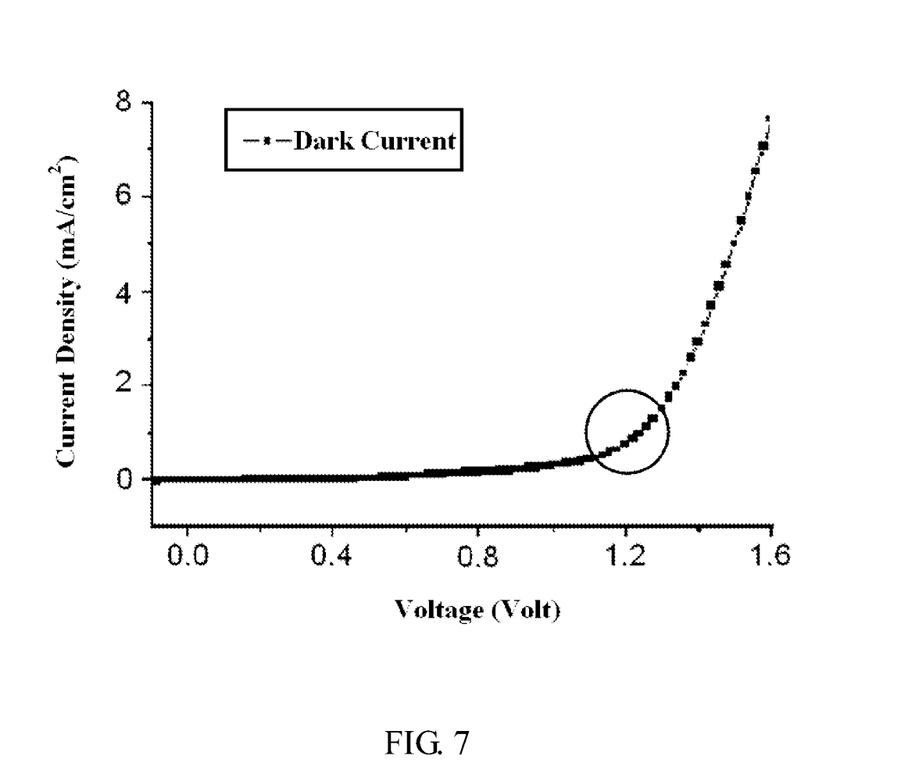
FIG. 7 is a diagram of measured result of dark current of a tandem solar cell formed by a single normal solar cell and a single inverted solar cell of one embodiment according to the present invention.
Figure 8:
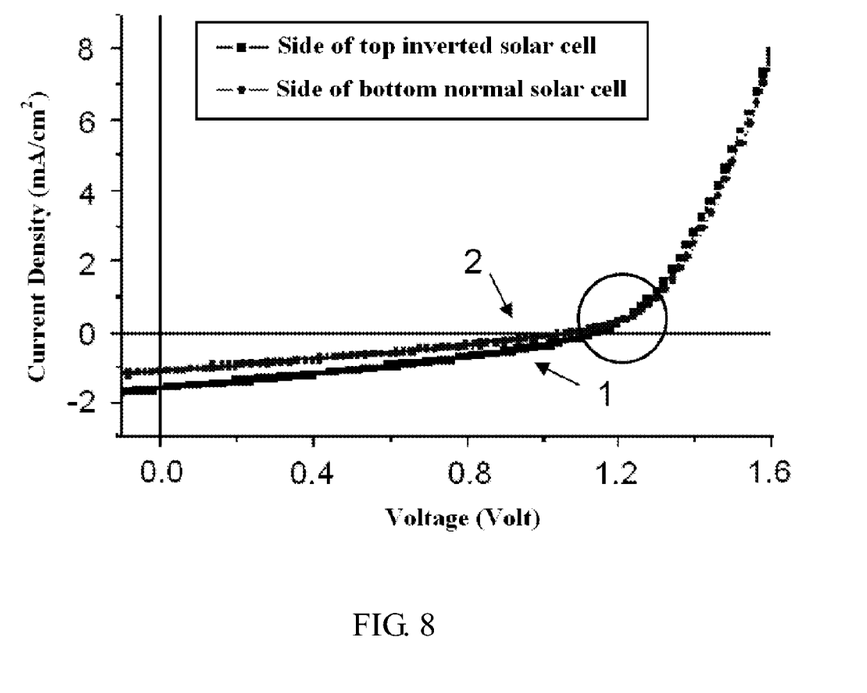
FIG. 8 is a diagram of measured result of photocurrent of the mentioned-above tandem solar cell after illuminating.

The advantages and efficiencies of the tandem solar cell device according to the present invention are described below. In principle, the electric properties of a solar cell device are measured and then drawn a current-voltage characteristic curve thereof for testing the solar cell device. Regarding to FIG. 7 and FIG. 8, a current-voltage characteristic curve of dark current of a tandem solar cell device of an embodiment according to the present invention is shown in FIG. 7, and a current-voltage characteristic curve of current generated by illuminating two side of the tandem solar cell device of the embodiment is shown in FIG. 8. In this embodiment, the tandem solar cell device is fabricated by pressing fit a normal solar cell device formed by a single normal solar sub-cell and an inverted solar cell device formed by a single inverted solar sub-cell for testing.

The current-voltage characteristic curve of a solar cell device is described first. In a current-voltage characteristic curve of a solar cell device, it can be read that the current approaches to a constant according to reverse bias. In forward bias, the solar cell device can be turned on and generate photocurrent with increasing voltage to a voltage value. Moreover, some important parameters of testing solar cell device comprise open-circuit voltage (Voc) and short-circuit current (Isc). The open-circuit voltage is defined as a voltage value measured when the external load is infinity; and the short-circuit current is defined as a voltage value measured when the external load is null. Both of the mentioned above parameters can be obtained from the current-voltage characteristic curve of the solar cell device.

Regarding to FIG. 7, it shows a current-voltage characteristic curve of a tandem solar cell device of an embodiment according to the present invention. The dark current is defined as the value of current through the solar cell device without illuminating. In forward bias, current density of the dark current initially measured maintains null. When the voltage value of the forward bias reaches about 1.15~1.2 volts, the device will be turned on and generate photocurrent shown as the circled area in FIG. 7.

Regarding to FIG. 8, it shows a current-voltage characteristic curve of the mentioned-above tandem solar cell device measured after illuminating. The curve 1 is a current-voltage characteristic curve measured after illuminating the side of the top inverted solar cell of the tandem solar cell device, and the curve 2 is a current-voltage characteristic curve measured after illuminating the side of the bottom normal solar cell of the tandem solar cell device. As shown in FIG. 8, the curves are similar with the curve of the dark current. When the voltage value of the forward bias reaches about 1.15~1.2 volts, the device will be turned on and generate photocurrent shown as the circled area in FIG. 8. In the solar cell, electron-hole pairs will be generated after illuminating, and separated by the internal electric field drifting to cathode and anode respectively. In this moment, the measured photocurrent is the short-circuit current (Isc) and the value of forward bias equates to the open-circuit voltage (Voc). Moreover, the curve 1 and curve 2 are almost overlapped in FIG. 8. That means that the solar cell device has good electric conductivity whether illuminating which side of the tandem solar cell device.

The measured value of the open-circuit voltage of the existing tandem solar cell device is between about 0.4~0.8 volts. The value of the open-circuit voltage of the tandem solar cell device of the present invention is higher than the existing tandem solar cell device as shown in FIGS. 7 and 8. After calculating, it can be obtained a high energy conversion power of the tandem solar cell device according to the present invention.

Therefore, a tandem solar cell device according to the present invention does not need to add the layers of the structure to achieve the objects of series/parallel connection of several solar sub-cells for increasing the open-circuit current and the energy conversion power of the tandem solar cell without adding its thickness. Moreover, the fabricating method of the tandem solar cell device of the present invention is easy to practice. The fabricating method only comprises that a top inverted solar cell and a bottom normal solar cell are fabricated first, and a pressing fit process of the top inverted solar cell and the bottom normal solar cell is executed. Thus, the fabricating method doesn't need to spin coating several layers of different solutions or perform in a vacuum environment. The simply fabricating method can reduce the cost of production effectively for achieving the effects of mass production.

While the embodiments of the present invention disclosed herein are presently considered to be preferred embodiments, various changes and modifications can be made without departing from the spirit and scope of the present invention. The scope of the invention is indicated in the appended claims, and all changes that come within the meaning and range of equivalents are intended to be embraced therein.

What is claimed is:

1. A fabricating method of a tandem solar cell, the steps comprising:
    providing a top inverted solar cell having a plurality of inverted solar sub-cells;
    providing a bottom normal solar cell having a plurality of normal solar sub-cells corresponding with the inverted solar sub-cells; and
    executing a pressing fit process of said top inverted solar cell and said bottom normal solar cell;
    wherein an interlayer and an anti-reflux protective device for preventing reflux occurrence are set between said bottom normal solar cell and said top inverted solar cell in said pressing fit process, wherein said interlayer includes a plurality of conductive dots, and said plurality of inverted solar sub-cells and said plurality of normal solar sub-cells are placed with an offset distance from each other, a solar sub-cell is formed after said pressing fit process of said inverted solar sub-cell and said normal solar sub-cell, and plurality of said solar sub-cell for series/parallel connection by said plurality of conductive dots.

2. The fabricating method as claimed in claim 1, wherein said inverted solar sub-cell further comprising:
    a hole blocking layer;
    a first active layer connected to said hole blocking layer;
    an electron blocking layer connected to said first active layer; and
    a first top electrode connected to said electron blocking layer.

3. The fabricating method as claimed in claim 2, wherein said bottom solar sub-cell further comprising:
    a hole transport layer;
    a second active layer connected to said hole transport layer; and
    a second top electrode connected to said second active layer.

4. The fabricating method as claimed in claim 3, wherein materials of said first top electrode comprise metal materials with high work function or other transparent conductive oxide; and materials of said second top electrode comprise metal materials with low work function or other transparent conductive oxide.

5. The fabricating method as claimed in claim 1, wherein said pressing fit process comprises roll-to-roll process.

6. The fabricating method as claimed in claim 1, materials of said interlayer comprise metal or semiconductor materials with bipolar transport property.

* * * * *